United States Patent [19]

Hoover

[11] 4,090,139
[45] May 16, 1978

[54] COMPLEMENTARY SYMMETRY FET MIXER CIRCUITS

[75] Inventor: Merle Vincent Hoover, Flemington, N.J.

[73] Assignee: RCA Corporation, New York, N.Y.

[21] Appl. No.: 774,274

[22] Filed: Mar. 4, 1977

Related U.S. Application Data

[63] Continuation of Ser. No. 684,237, May 7, 1976, abandoned.

[51] Int. Cl.² .............................................. H04B 1/28
[52] U.S. Cl. ................................. 325/451; 330/264; 330/270; 307/304
[58] Field of Search ............... 325/446, 449, 442, 450, 325/451; 321/60, 65, 69 NL; 307/251, 279, 288, 304; 330/263–265, 269–271

[56] References Cited

U.S. PATENT DOCUMENTS

| | | | |
|---|---|---|---|
| 2,088,432 | 7/1937 | Peterson | 325/450 |
| 2,538,715 | 1/1951 | Van Weel | 325/450 |
| 3,383,601 | 5/1968 | Squires | 325/450 |
| 3,727,078 | 4/1973 | Wollesen | 307/304 |
| 3,886,464 | 5/1975 | Dingwall | 330/269 |

Primary Examiner—Benedict V. Safourek
Assistant Examiner—Jin F. NG
Attorney, Agent, or Firm—H. Christoffersen; S. Cohen; A. L. Limberg

[57] ABSTRACT

Series-connected, field-effect transistors (FET's) of complementary conductivity types are employed to mix two or more input signals. The transistors are quiescently biased in their linear operating range. Each input signal is applied to the gate electrode of one FET and the gate electrode of the corresponding FET of opposite conductivity type in the series string. The output signal containing sum and difference frequencies is available at a common drain connection between two adjacent transistors of opposite conductivity types at the center of the string.

17 Claims, 2 Drawing Figures

COMPLEMENTARY SYMMETRY FET MIXER CIRCUITS

This is a continuation of Application Ser. No. 684,237 filed May 7, 1976, now abandoned.

This invention relates generally to mixer circuits and more particularly to such circuits employing field-effect transistors (FET's).

FET's, such as those of the metal-oxide-semiconductor (MOS) type, are widely used in mixer circuits. One form of transistor which is particularly popular is the dual-gate, N-channel, depletion-mode, MOS/FET device. It is usually operated in the cascode mode; that is, one of the gate electrodes of the transistor to which the signal at one frequency is applied serves as an input to a common-source amplifier and the other gate electrode to which the signal at a second frequency is applied serves as an input to a common gate stage. Such circuit configurations tend to be complex in the sense that a fair number of peripheral elements, such as resistors, are required. Other mixer circuits employ individual FET's of the same conductivity type and these too require a substantial number of peripheral components. A typical mixer circuit of the latter type is shown in the RCA Solid State 1975 DataBook Series SSD-202C, page 83, FIG. 32.

The circuits of the present application employ complementary symmetry transistors, such as those of the enhancement-mode, MOS type. The transistors are connected in series and each input signal is applied to the gate electrode of one FET and the gate electrode of the corresponding FET of opposite conductivity type in the series string. The output signal is available at the common-drain electrode connection between two adjacent transistors of opposite conductivity type at the center of the string.

Figure 1:
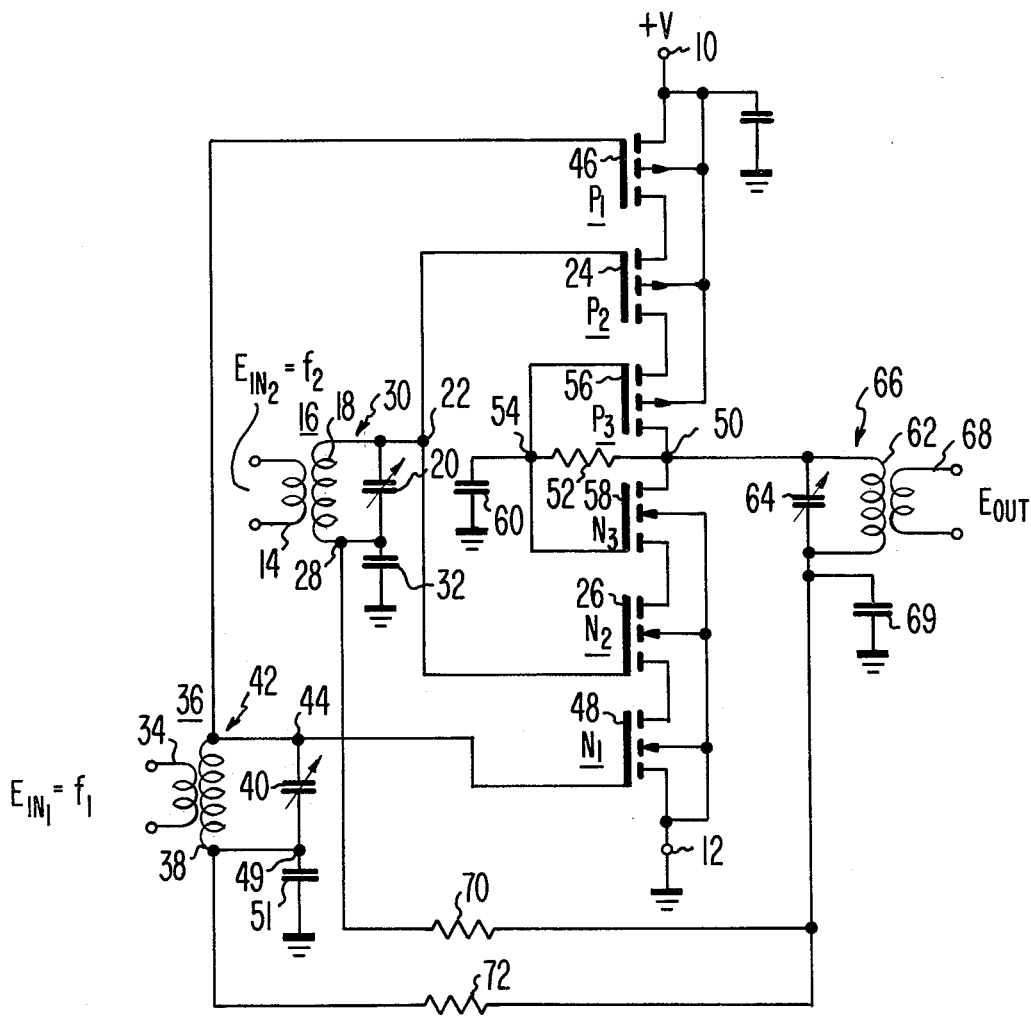
FIG. 1 is a schematic diagram of a cascode mixer embodying the invention.

The circuit of FIG. 1 includes six transistors, three of which $P_1$, $P_2$ and $P_3$ are of one conductivity type (P) and the other three $N_1$, $N_2$ and $N_3$ of which are of complementary conductivity type (N). These transistors may be of the MOS enhancement type. Their conduction paths are connected in series between a terminal 10 for an operating voltage $+V$ and a terminal 12 at a reference voltage level, shown here as ground. An input signal $E_{IN_2}$ which may be at a modulating frequency $f_2$ is applied to the primary winding 14 of a transformer 16. The secondary winding 18 of this transformer and a variable capacitor 20 together form a parallel resonant circuit which is tuned to frequency $f_2$. This circuit is connected at one terminal 22 to the gate electrode 24 of P-type transistor $P_2$ and to the gate electrode 26 of N-type transistor $N_2$. The other terminal 28 of the resonant circuit 30 is connected to AC ground by capacitor 32.

Another input signal $E_{IN_1}$ which may be at a carrier frequency $f_1$, is supplied to the primary winding 34 of a transformer 36. The secondary winding 38 and a variable capacitor 40 together form a parallel resonant circuit which is tuned to the frequency $f_1$. This circuit is connected at one terminal 44 to the gate electrode 46 of P-type transistor $P_1$ and to the gate electrode 48 of N-type transistor $N_1$ and at its other terminal 49 to AC ground by capacitor 51.

The third pair of COS/MOS transistors are connected to one another (drain electrode-to-drain electrode) at output terminal 50. Biasing resistor 52 connects this common drain connection to a common gate electrode connection 54 of transistors $P_3$ and $N_3$ and serves to bias the gate electrodes 56 and 58 at a direct voltage level equal to that at terminal 50. These two transistors, in other words, are biased at the center region of their linear operating range. For a discussion of such linear operation, see the Databook RCA Linear Integrated Circuits, SSD-201C, 1975, the article relating to the CA 3600E, starting on page 588. FIG. 13, page 593, illustrates the type of quiescent biasing employed herein.) The gate electrodes 56 and 58 are AC coupled to ground by capacitor 60.

The output circuit for the cascode mixer comprises a coil 62 and variable capacitor 64 which together form a parallel resonant circuit 66. The latter is connected at one terminal to output terminal 50 and at its other terminal to AC ground via capacitor 69. The parallel resonant circuit 66 is tuned to one of the side-band frequencies $f_2+f_1$ or $f_2-f_1$ and an output signal at this frequency is available at the terminals of winding 68 which is coupled to coil 62.

It is mentioned above that the COS/MOS pair $P_3$, $N_3$ is biased in the linear region of its operating range; the other COS/MOS pairs are also biased to operate in their linear region. Resistor 70 which is connected via DC paths between output terminal 50 and gate electrodes 24 and 26 so biases the COS/MOS pair $P_2$, $N_2$; resistor 72 performs the biasing function for the COS/MOS pair $P_1$, $N_1$. It may be observed that all of the transistors are biased at the drain electrode potential of transistors $P_3$ and $N_3$. Thus, a transistor such as $N_1$ operates with its gate electrode quiescently biased more positively than its drain electrode and similarly a transistor such as $P_1$ has its gate electrode more negative than (actually less positive than) its drain electrode. These transistors, in other words, quiescently conduct. The amount of quiescent current flow is controlled by the COS/MOS pair which is forward biased the least, that is, pair $P_3$, $N_3$. During operation as a mixer, the signal amplitudes can be chosen to operate the amplifiers only in their relatively linear region or, if higher non-linear signal content is desired in the output, they can be driven into their non-linear operating regions.

In operation, as already mentioned, the transistors all quiescently conduct. The input signal $E_{IN_2}$ applied to winding 14 varies the potential at the gate electrodes 24 and 26 of COS/MOS pair $P_2$, $N_2$ and thereby modulates the conductivity of the conduction paths of these transistors and therefore the output potential at 50. If, for example, the voltage at node 22 goes relatively positive, the impedance of the conduction path of transistor $P_2$ increases. This tends to drive the output signal at 50 closer to ground. Concurrently, the conduction path impedance of transistor $N_2$ is decreased. Thus, the impedance between point 50 and ground decreases and this too tends to drive output terminal 50 closer to ground. In similar fashion, the input signal $E_{IN_1}$ applied to winding 34 causes variation in the potential at the gate electrodes of COS/MOS pair $P_1$, $N_1$ and modulates the conductivity of the conduction channels of these transistors. Here the effects of these changes in conductivity is reflected in a manner similar to that discussed above as a change in the voltage at output terminal 50, which change can be in the same sense as or in an opposite sense to the change which resulted from input signal $E_{IN_2}$. In other words, the instantaneous voltage at point 50 is a result of the conduction path modulation by both signals $E_{IN_1}$ and $E_{IN_2}$.

The third COS/MOS pair $P_3$, $N_3$ which is connected at node 54 to AC ground serves as a common-gate (grounded-gate) amplifier and, as such, operates as a cascode connection with respect to the other COS/MOS pairs. This common gate amplifier serves to isolate the output terminal 50 from the amplifying stages for the signals at frequencies $f_2$ and $f_1$. The signal appearing at output terminal 50 includes the two side-bands of interest and other frequency components. The parallel resonant circuit 66 tuned to the desired side-band frequency, discriminates against the frequency components not of interest. The desired output signal is available at the output winding 68.

While not illustrated, it is to be understood that the functioning of pair $N_3$, $P_3$ may be interchanged with that of pair $N_2$, $P_2$. This may be accomplished by disconnecting parallel resonant circuit 30 from node 22 and connecting it to node 54 and disconnecting capacitor 60 from node 54 and connecting it to node 22. In this embodiment, the pair $P_2$, $N_2$ operates in the grounded-gate mode thereby serving to isolate the signal source for $E_{IN_1}$ from the signal source for $E_{IN_2}$. In this latter case, the cascode arrangement is comprised of $N_1$, $P_1$ and $N_2$, $P_2$.

Figure 2:
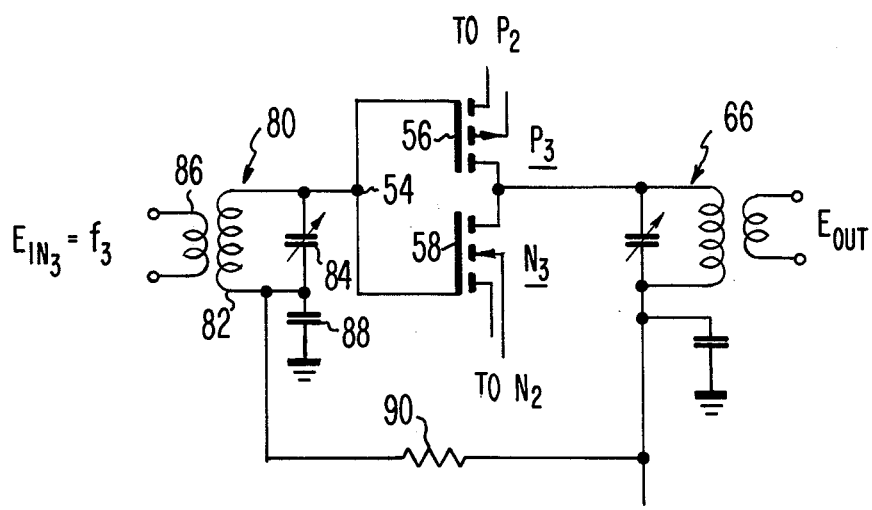
FIG. 2 is a schematic diagram of a portion of a second embodiment of the invention.

FIG. 2 shows how the circuit of FIG. 1 may be modified to mix three frequencies rather than two. The connections to the first and second COS/MOS pairs $P_1$, $N_1$ and $P_2$, $N_2$ are the same as in FIG. 1 and therefore are not shown. However, the common node 54 at the gate electrodes 56 and 58, rather than being connected to AC ground, is connected to a third parallel resonant circuit 80 comprising a coil 82 and variable capacitor 84. This circuit is tuned to the frequency $f_3$ of the third input signal $E_{IN_3}$ which is applied to the winding 86 which is coupled to coil 82. Capacitor 88 serves to connect the other terminal of the parallel circuit to AC ground. Resistor 90 is a biasing resistor comparable to resistor 52 of FIG. 1 and serves to bias the third COS/MOS pair $P_3$, $N_3$ at the center of its linear operating range. With the removal of the common-base amplifier, the circuit of FIG. 2 no longer functions as a cascode amplifier. However, the circuit does function to mix three frequencies and the output circuit 66 may be tuned to any one of the sum or difference frequencies of the three frequencies $f_1$, $f_2$ and $f_3$ which is of interest.

While the invention has been illustrated in terms of a mixer employing a single string of series connected COS/MOS transistors, it is to be understood that modifications within the scope of the present invention are possible. For example, if two such strings of transistors are employed, the circuit may be operated as a push-pull mixer. In this embodiment each tuned circuit would be connected between the gate electrodes of corresponding transistors in the two strings rather than being connected between the gate electrodes and AC ground. For example, referring to FIG. 1, tuned circuit 42 would be connected at terminal 44 to transistor $P_1$ in the first string and at terminal 49 to the corresponding transistor, call it $P_1'$, in the second string. This tuned circuit would also be connected at terminal 44 to transistor $N_1$ in the first string and at terminal 49 to the corresponding transistor $N_1'$ in the second string. The DC biasing via a resistor such as 72 could be similar to that shown and could be connected to, for example, terminal 49 or terminal 44. The other tuned circuit 30 would be similarly connected to $P_2$, $P_2'$, $N_2$ and $N_2'$.

What is claimed is:

1. A mixer comprising, in combination:
   first and second terminals between which an operating voltage may be applied;
   a circuit output terminal;
   six field effect transistors, first and second and third of these transistors being of a first conductivity type and fourth and fifth and sixth of these transistors being of a second conductivity type complementary to said first conductivity type, each transistor having a conduction path between input and output electrodes and having a control electrode, the conduction paths of said first and second and third transistors being serially connected between said first terminal and said output terminal, and the conduction paths of said fourth and fifth and sixth transistors being serially connected between said second terminal and said output terminal;
   means for quiescently biasing all of said transistors in the linear region of their operating range including:
   means for applying similar quiescent potentials to the control electrodes of said first and fourth transistors thereby to connect them as a first complementary conduction pair,
   means for applying similar quiescent potentials to the control electrodes of said second and fifth transistors thereby to connect them as a second complementary conduction pair, and
   means for applying similar quiescent potentials to the control electrodes of said third and sixth transistors, thereby to connect them as a third complementary conduction pair;
   means for applying a first input signal at frequency $f_1$ to the control electrodes of said first and fourth transistors;
   means for applying a second input signal at frequency $f_2$ to the control electrodes of said second and fifth transistors; and
   a tuned output circuit coupled between said output terminal and another circuit point, said circuit being tuned to the one of the output signal frequency components of interest available at said output terminal.

2. A mixer as set forth in claim 1, wherein said third and sixth transistors are connected at their output electrodes to said output terminal and at their control electrodes to a point of alternating current ground.

3. A mixer as set forth in claim 1, wherein said third and sixth transistors are connected at their output electrodes to said output terminal, and further including:
   means for applying a signal at a third frequency to the control electrodes of said third and sixth transistors.

4. A mixer as set forth in claim 1, wherein said means for applying similar quiescent potentials to the control electrodes of said first and fourth transistors comprises first resistive means connected between said output terminal and the control electrodes of said first and fourth transistors, said means for applying similar quiescent potentials to the control electrodes of said second and fifth transistors comprises second resistive means connected between said output terminal and the control electrodes of said second and fifth transistors, and said means for applying similar quiescent potentials to the control electrodes of said third and sixth transistors comprises third resistive means connected between said output terminal and the control electrodes of said third and sixth transistors.

5. A mixer comprising, in combination:
first and second terminals between which an operating voltage may be applied;
a circuit output terminal;
six MOS transistors, the first and second and third of P-type and the fourth and fifth and sixth of N-type, each transistor having a conduction path between source and drain electrodes and having a gate electrode, the conduction paths of the first and second and third transistors being serially connected between said first terminal and said output terminal, and the conduction paths of the fourth and fifth and sixth transistors being serially connected between said second terminal and said output terminal;
means for quiescently biasing the gate electrodes of the first and fourth transistors at a voltage level such that each operates in the linear region of its operating range whereby the first and fourth transistors operate as a first complementary conduction pair;
means for quiescently biasing the gate electrode of said second and fifth transistors at a voltage level such that each operates in the linear region of its operating range, whereby the second and fifth transistors operate as a second complementary conduction pair;
means for quiescently biasing the gate electrodes of said third and sixth transistors at a voltage level such that each operates in the linear region of its operating range, whereby the third and sixth transistors operate as a third complementary conduction pair;
a first parallel tuned circuit, tuned to frequency $f_1$, connected at one terminal to AC ground and at its other terminal to the gate electrodes of said first and fourth transistors;
means for introducing a signal at frequency $f_1$ to said first circuit;
a second parallel tuned circuit, this one tuned to frequency $f_2$, connected at one terminal to AC ground and at its other terminal to the gate electrodes of said second and fifth transistors;
means for introducing a signal at frequency $f_2$ to said second circuit; and
a third parallel tuned circuit tuned to one of the frequency components present at said output terminal connected between said output terminal and AC ground.

6. A mixer as set forth in claim 5, further including:
means connecting the gate electrodes of said third and sixth transistors to AC ground.

7. A mixer as set forth in claim 5, further including:
a fourth parallel tuned circuit, this one tuned to frequency $f_3$, connected at one terminal to AC ground and at its other terminal to the gate electrodes of said third and sixth transistors.

8. A mixer as set forth in claim 1 wherein the conduction paths of said first and second and third transistors are serially connected in order of their numbering between said first terminal and said output terminal and wherein the conduction paths of said fourth and fifth and sixth transistors are serially connected in order of their numbering between said second terminal and said output terminal.

9. A mixer as set forth in claim 5 wherein the conduction paths of said first and second and third transistors are serially connected in order of their numbering between said first terminal and said output terminal and wherein the conduction paths of said fourth and fifth and sixth transistors are serially connected in order of their numbering between said second terminal and said output terminal.

10. A mixer comprising, in combination:
first and second terminals between which an operating voltage may be applied;
a circuit output terminal;
first and second field effect transistors of a first conductivity type having respective conduction paths in a series connection between said first terminal and said output terminal and having respective gate electrodes;
third and fourth field effect transistors of a second conductivity type having respective conduction paths in a series connection between said second terminal and said output terminal and having respective gate electrodes, said first and said second conductivity types being complementary to each other;
means for quiescently biasing said first and second and third and fourth transistors in the linear region of their operating range including
means for applying similar quiescent potentials to the gate electrodes of said first and third transistors thereby to connect them as a first complementary conductivity pair, and
means for applying similar quiescent potentials to the control electrodes of said second and fourth transistors thereby to connect them as a second complementary conduction pair;
means for applying a first input signal at frequency $f_1$ to the gate electrodes of said first and third transistors;
means for applying a second input signal at frequency $f_2$ to the gate electrodes of said second and fourth transistors; and
an output circuit coupled between said output terminal and said circuit point, for selecting one of the sum and difference frequencies of $f_1$ and $f_2$ available responsive to $f_1$ and $f_2$.

11. A mixer as set forth in claim 10 including fifth and sixth field effect transistors of said first and said second conductivity types, respectively, each having a gate electrode and a conduction path, the conduction path of said fifth field effect transistor being included in said series connection between said first terminal and said output terminal in the position closest to said output terminal, the conduction path of said sixth field effect transistor being included in said series connection between said second terminal and said output terminal in the position closest to said output terminal; and
means for applying similar quiescent potentials to the gate electrodes of said fifth and said sixth transistors thereby to connect them as a third complementary conduction pair.

12. A mixer as set forth in claim 11 wherein said means for applying similar quiescent potentials to the gate electrodes of said fifth and sixth transistors includes a resistance connected between said output terminal and an interconnection between the gate electrodes of said fifth and sixth transistors, and includes:
a capacitance connected between said interconnection between the gate electrodes of said fifth and sixth transistors and one of said first and second terminals.

13. A mixer as set forth in claim 10 wherein said means for applying similar quiescent potentials to the gate electrodes of said first and third transistors includes a first resistance having a first end connected to said output terminal and having a second end, a first capacitor connecting the second end of said first resistance to one of said first and second terminals, and a first inductor connecting the second end of said first resistance and an interconnection between the gate electrodes of said first and third transistors.

14. A mixer as set forth in claim 13 wherein said means for applying similar quiescent potentials to the gate electrodes of said second and fourth transistors includes a second resistance having a first end connected to said output terminal and having a second end, a second capacitor connecting the second end of said first resistance to one of said first and second terminals, and a second inductor connecting the second end of said second resistance and an interconnection between the gate electrodes of said second and fourth transistors.

15. A cascode configuration comprising:
  means for supplying an input signal potential;
  first and second terminals for receiving an operating voltage therebetween;
  a signal output terminal;
  first and second n-channel field effect transistors of the enhancement mode type and first and second p-channel field effect transistors of the enhancement mode type, each of said field effect transistors having source and drain and gate electrodes, the source electrodes of said first n-channel transistor and of said first p-channel transistor being respectively connected to said first terminal and to said second terminal, the drain electrodes of said first n-channel transistor and of said first p-channel transistor being respectively connected to the source electrode of said second n-channel transistor and to the source electrode of said second p-channel transistor, the drain electrodes of said second n-channel transistor and of said second p-channel transistor being connected to said output terminal;
  low-pass filtering network means having an input connection to which said output terminal connects and having first and second output connections for providing first and second direct bias potentials each equal to the quiescent potential at said output terminal, said second output connection connected to the gate electrodes of said second n-channel and second p-channel transistors to apply said second direct bias potential to each of them;
  means for additively combining said input signal potential with said first direct bias potential to provide a potential to the gate electrodes of said first n-channel and first p-channel transistors.

16. A cascode onfiguration as set forth in claim 15 wherein said low pass filtering network means includes
  first and second resistances respectively connecting said output terminal to a point of connection and to an interconnection between the gate electrodes of said second n-channel and second p-channel transistors,
  a first capacitor connected for by-passing said point of interconnection for signal, and
  a second capacitor connected for by-passing said interconnection between the gate electrodes of said second n-channel and said second p-channel transistors for signal; and wherein said means for additively combining said input signal with said first direct bias potential includes
  a coil connecting said point of connection to an interconnection between the gate electrodes of said first n-channel and said first p-channel transistors and
  means for inducing input signal potential across said coil.

17. A cascode configuration as set forth in claim 16 wherein said coil is the secondary winding of a transformer also having a primary winding, included in said means for inducing input signal potential.

* * * * *

UNITED STATES PATENT OFFICE
CERTIFICATE OF CORRECTION

PATENT NO. : 4,090,139

DATED : May 16, 1978

INVENTOR(S) : Merle Vincent Hoover

It is certified that error appears in the above-identified patent and that said Letters Patent are hereby corrected as shown below:

IN THE CLAIMS

Col. 7, line 17; "first resistance" should be --second resistance--.

Col. 8, line 16; "onfiguration" should be --configuration--.

Col. 8, lines 19-20 should read; "said output terminal to first and second points of interconnection, respectively, said first point of interconnection being between the gate electrodes of said second n-channel and second p-channel transistors".

Col. 8, line 25; insert after "said" the words --second point of--.

Col. 8, line 31 should read; "a coil connecting said second point of interconnection to a third point of inter-".

Signed and Sealed this

Tenth Day of October 1978

[SEAL]

Attest:

RUTH C. MASON
Attesting Officer

DONALD W. BANNER
Commissioner of Patents and Trademarks